(12) United States Patent
Isozaki

(10) Patent No.: US 11,631,622 B2
(45) Date of Patent: Apr. 18, 2023

(54) SEMICONDUCTOR DEVICE AND SEMICONDUCTOR DEVICE MANUFACTURING METHOD

(71) Applicant: FUJI ELECTRIC CO., LTD., Kawasaki (JP)

(72) Inventor: Makoto Isozaki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 155 days.

(21) Appl. No.: 16/909,342

(22) Filed: Jun. 23, 2020

(65) Prior Publication Data
US 2021/0066146 A1 Mar. 4, 2021

(30) Foreign Application Priority Data

Sep. 3, 2019 (JP) .............................. JP2019-160393

(51) Int. Cl.
*H01L 23/12* (2006.01)
*H01L 23/04* (2006.01)
(Continued)

(52) U.S. Cl.
CPC .............. *H01L 23/12* (2013.01); *H01L 23/04* (2013.01); *H01L 23/049* (2013.01); *H01L 24/29* (2013.01); *H01L 24/32* (2013.01); *H01L 24/83* (2013.01); *H01L 25/072* (2013.01); *H05K 3/301* (2013.01); *H01L 2924/13055* (2013.01)

(58) Field of Classification Search
CPC ......... H05K 3/301; H01L 23/04; H01L 23/12; H01L 25/072; H01L 24/29; H01L 24/32; H01L 24/37; H01L 24/40; H01L 24/45; H01L 24/48; H01L 24/66; H01L 24/69; H01L 2924/13055
See application file for complete search history.

(56) References Cited

U.S. PATENT DOCUMENTS

2008/0217760 A1   9/2008  Yoshihara et al.
2013/0250535 A1*  9/2013  Takamiya ............. H01L 25/072
                                                        174/250
(Continued)

FOREIGN PATENT DOCUMENTS

JP   2008-252055 A   10/2008
JP   2014-187179 A   10/2014
JP   2018-107395 A    7/2018

*Primary Examiner* — Victoria K. Hall
(74) *Attorney, Agent, or Firm* — Rabin & Berdo, P.C.

(57) ABSTRACT

A semiconductor device, including a substrate having an insulating plate and a conductive plate formed on the insulating plate, a semiconductor chip formed on the conductive plate, a contact part arranged on the conductive plate with a bonding member therebetween, a rod-shaped external connection terminal having a lower end portion thereof fitted into the contact part, and a lid plate having a front surface and a back surface facing the substrate. An insertion hole pierces the lid plate, forming an entrance and exit respectively on the back and front surfaces of the lid plate. The external connection terminal is inserted in the insertion hole. The semiconductor device has at least one of a guide portion with an inclined surface, fixed to a portion of the external connection terminal located in the insertion hole, or an inclined inner wall of the insertion hole.

20 Claims, 16 Drawing Sheets

(51) Int. Cl.
  *H05K 3/30*    (2006.01)
  *H01L 25/07*   (2006.01)
  *H01L 23/00*   (2006.01)
  *H01L 23/049*  (2006.01)

(56) References Cited

U.S. PATENT DOCUMENTS

| | | | |
|---|---|---|---|
| 2014/0001619 A1* | 1/2014 | Yoo | H01L 23/3735 |
| | | | 257/676 |
| 2014/0210067 A1* | 7/2014 | Takamiya | H01L 21/52 |
| | | | 257/698 |
| 2014/0317896 A1 | 10/2014 | Maruyama et al. | |
| 2018/0122927 A1* | 5/2018 | Sekino | H01R 4/01 |
| 2018/0183161 A1 | 6/2018 | Soyano | |
| 2019/0067166 A1* | 2/2019 | Ichikawa | H01L 23/49827 |
| 2021/0134710 A1* | 5/2021 | Kubouchi | H01L 23/50 |
| 2021/0384109 A1* | 12/2021 | Tanimoto | H01L 21/565 |

* cited by examiner

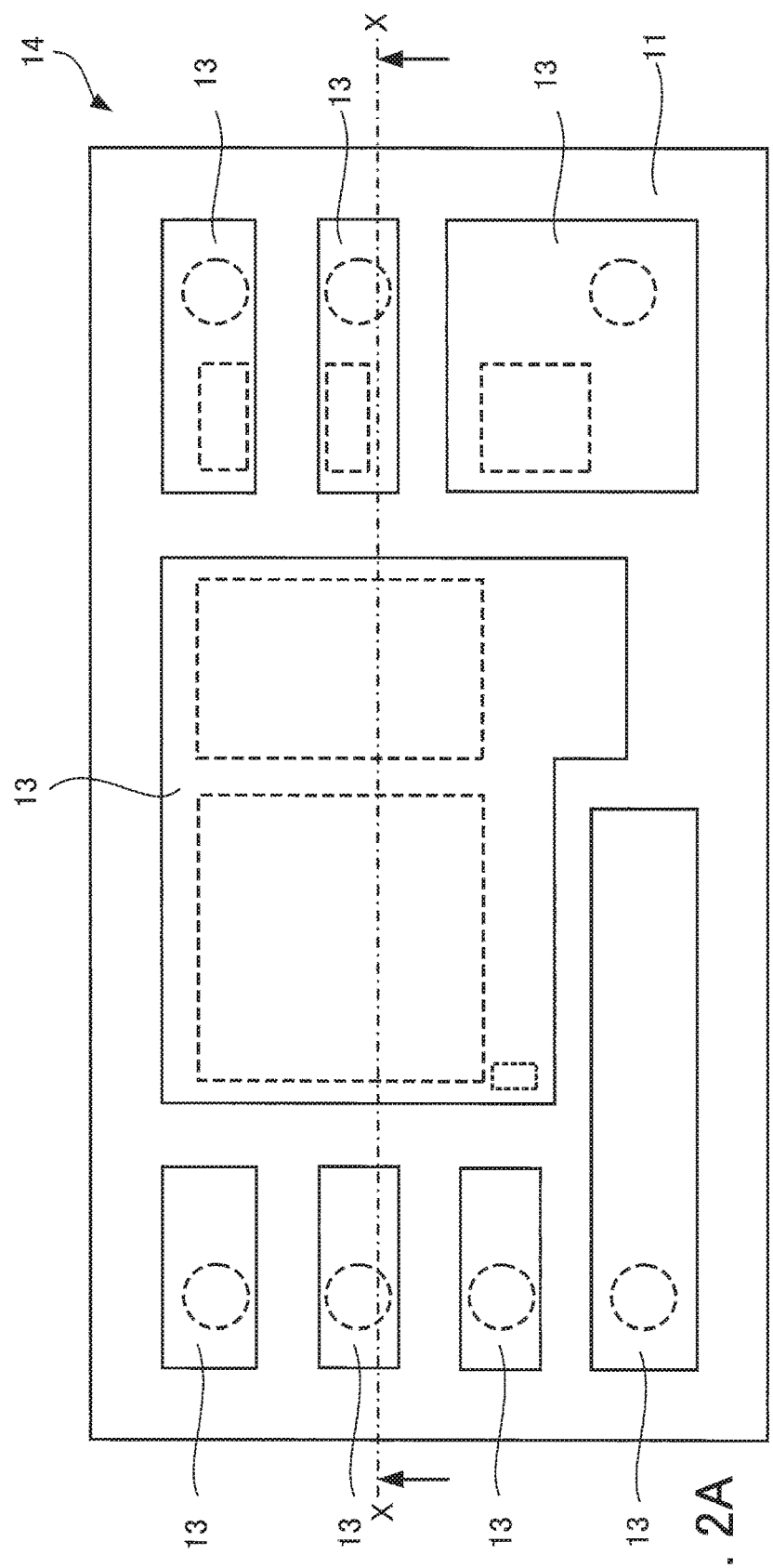
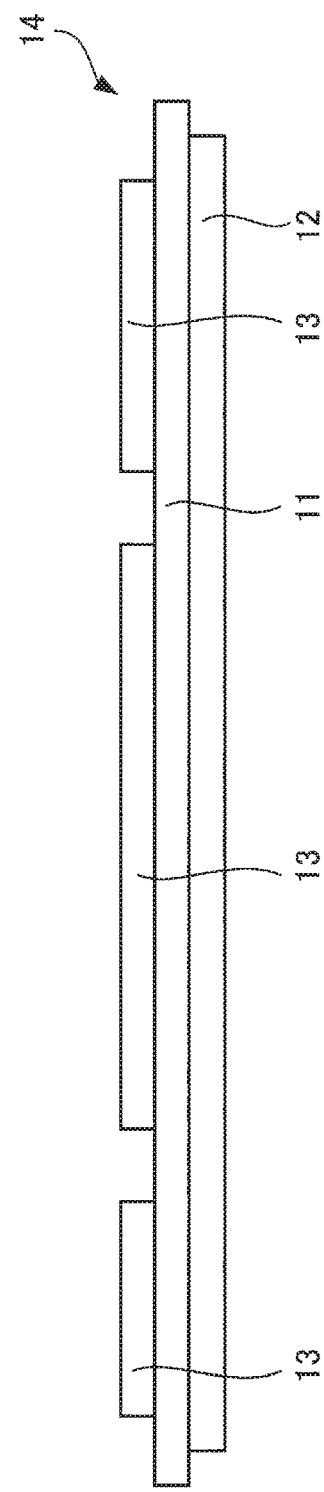
FIG. 2A
FIG. 2B

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2019-160393, filed on Sep. 3, 2019, the entire contents of which are incorporated herein by reference.

BACKGROUND OF THE INVENTION

1. Field of the Invention

The embodiments discussed herein relate to a semiconductor device and a semiconductor device manufacturing method.

2. Background of the Related Art

Semiconductor devices include semiconductor chips such as an insulated gate bipolar transistor (IGBT), a power metal oxide semiconductor field effect transistor (MOSFET), and the like. For example, these semiconductor devices are used as power converters. Such a semiconductor device includes a substrate having an insulating plate and a plurality of conductive plates formed over the front surface of the insulating plate. Furthermore, semiconductor chips and external connection terminals are arranged over the conductive plates and a signal inputted from an external connection terminal is inputted via a conductive plate to a semiconductor chip. In addition, a principal current is inputted from and outputted to an external connection terminal, flows through a conductive plate, and is switched by a semiconductor chip. In order to fix an external connection terminal to a conductive plate, a cylindrical contact part bonded to the conductive plate by solder is used. By fitting the external connection terminal into the contact part, the external connection terminal is electrically connected to the conductive plate via the contact part. Furthermore, the external connection terminal is inserted into an insertion hole in a lid plate of a sheath case to fix the sheath case to the substrate (see, for example, Japanese Laid-open Patent Publication No. 2014-187179).

In addition, a printed-circuit board is fixed to the external connection terminal protruding in this way from the insertion hole in the lid plate of the sheath case. As a result, the external connection terminal and the printed-circuit board are electrically connected. Accordingly, there is need for the external connection terminal to be perpendicular to the printed-circuit board.

However, if the contact part slightly inclines for some reason or other, then the external connection terminal fitted into the contact part is also fixed in a state in which the external connection terminal inclines with respect to the printed-circuit board. Even if the inclined external connection terminal is inserted into the insertion hole in the lid plate of the sheath case and protrudes, the external connection terminal is not fixed to a proper position on the printed-circuit board because the external connection terminal inclines.

SUMMARY OF THE INVENTION

According to an aspect, there is provided a semiconductor device including a substrate including an insulating plate, and a conductive plate formed on a front surface of the insulating plate; a semiconductor chip formed on a front surface of the conductive plate; a contact part arranged on the conductive plate with a bonding member therebetween; an external connection terminal including a rod-shaped body portion, the body portion having a lower end portion thereof fitted into the contact part; and a lid plate having a front surface and a back surface, the back surface facing the substrate, the lid plate having an insertion hole that pierces the lid plate, forming an entrance and an exit respectively on the back and front surfaces of the lid plate, the body portion of the external connection terminal being inserted in the insertion hole, wherein the semiconductor device has a first configuration or a second configuration, or both of the first and second configurations, the first configuration being that the body portion has a guide portion fixed to a portion of a side of the body portion, the portion of the body portion being housed in the insertion hole, the second configuration being that the insertion hole has an inclined inner wall, the guide portion and the inclined inner wall having an inclined surface inclining towards a center of the external connection terminal with respect to a direction from the entrance to the exit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 2A and 2B are views for describing a ceramic circuit board in the first embodiment;

DETAILED DESCRIPTION OF THE INVENTION

Embodiments will now be described with reference to the accompanying drawings. In the following description a "front surface" or an "upper surface" indicates a surface of a semiconductor device 10 of FIG. 1 which faces upward. Similarly, an "upside" indicates the upper side of the semiconductor device 10 of FIG. 1. A "back surface" or a "lower surface" indicates a surface of the semiconductor device 10 of FIG. 1 which faces downward. Similarly, a "downside" indicates the lower side of the semiconductor device 10 of FIG. 1. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present embodiments. For example, the "upside" or the "downside" does not always mean the vertical direction relative to the ground. That is to say, a direction indicated by the "upside" or the "downside" is not limited to the gravity direction.

First Embodiment

Figure 1:
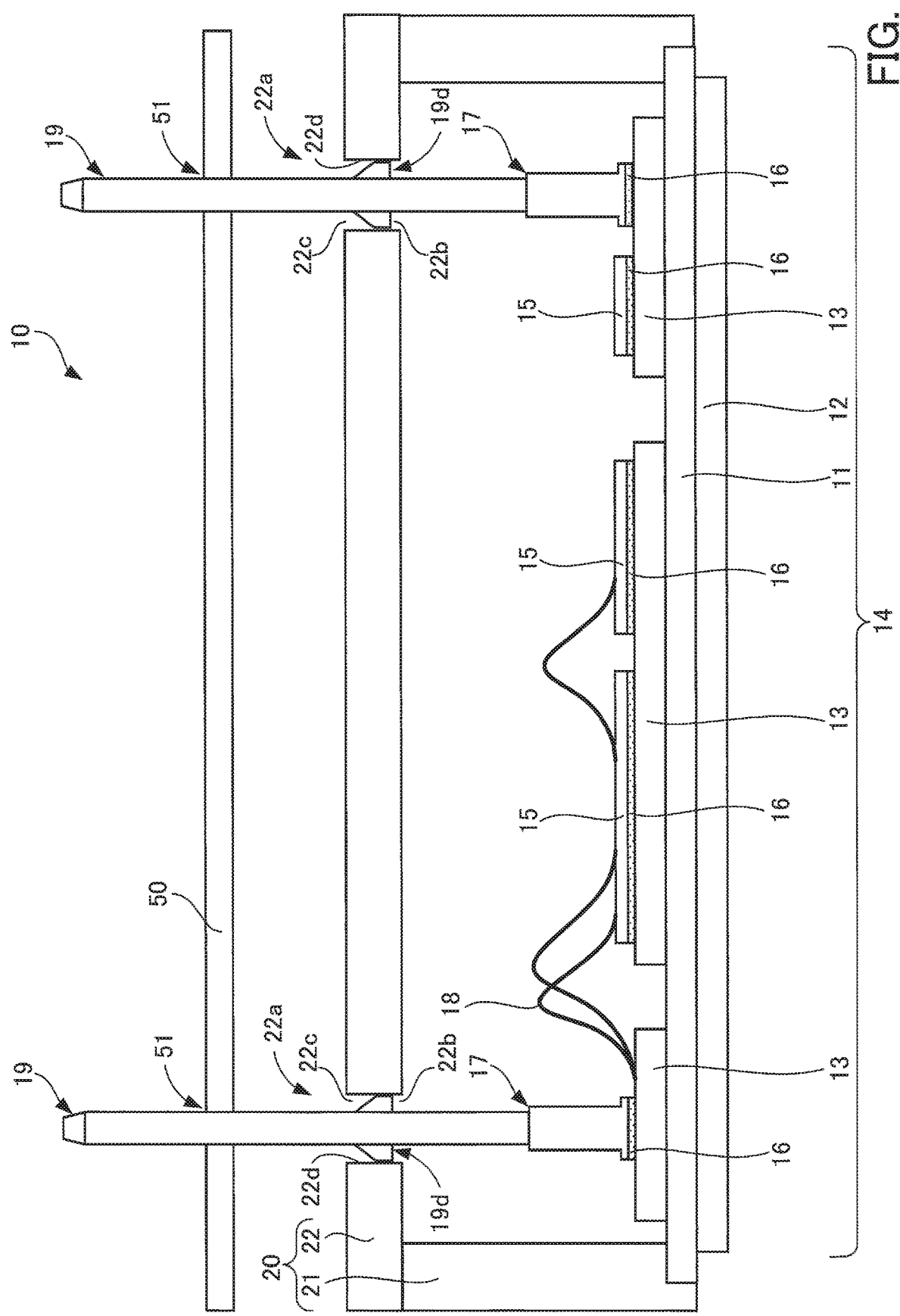
FIG. 1 is a sectional view of a semiconductor device according to a first embodiment.
Figure 3A:
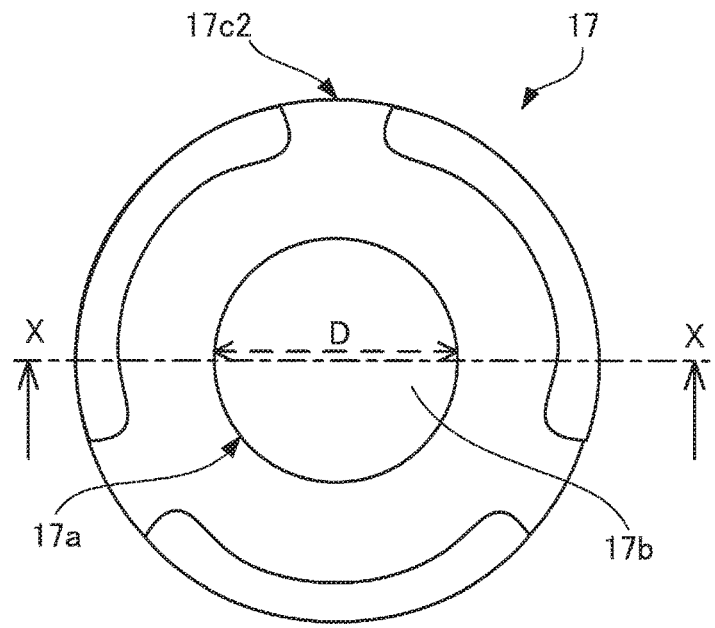
FIGS. 3A and 3B are views for describing a contact part in the first embodiment.
Figure 3B:
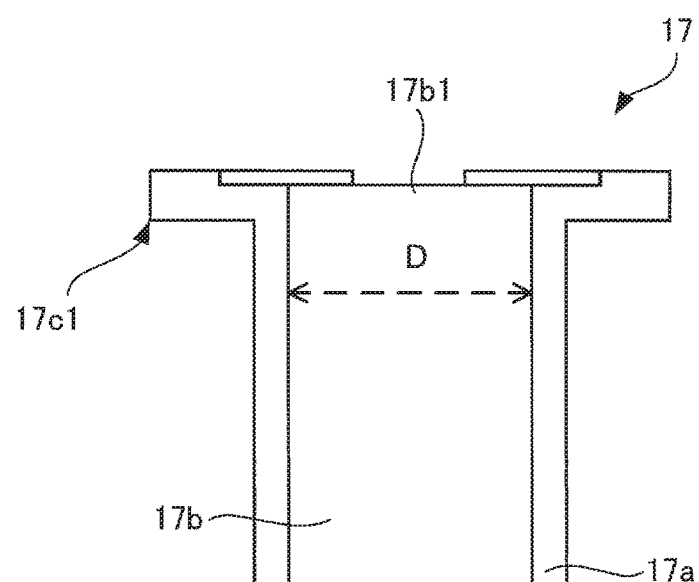
Figure 4B:
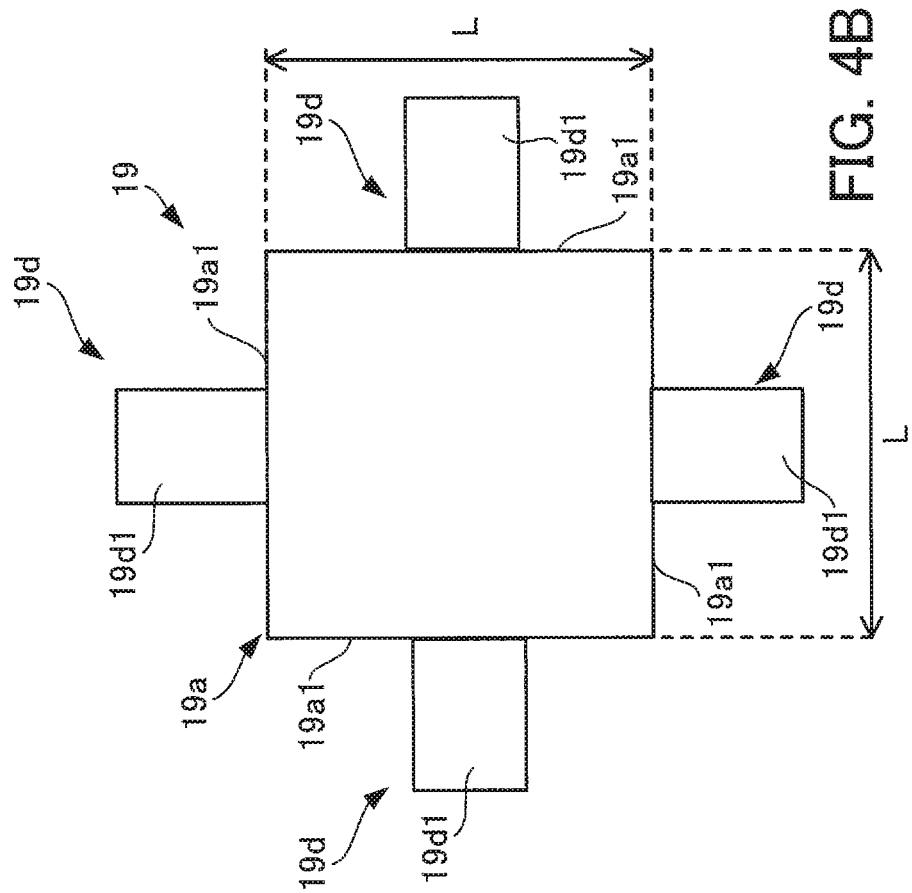
FIGS. 4A and 4B are views for describing an external connection terminal in the first embodiment.
Figure 4A:
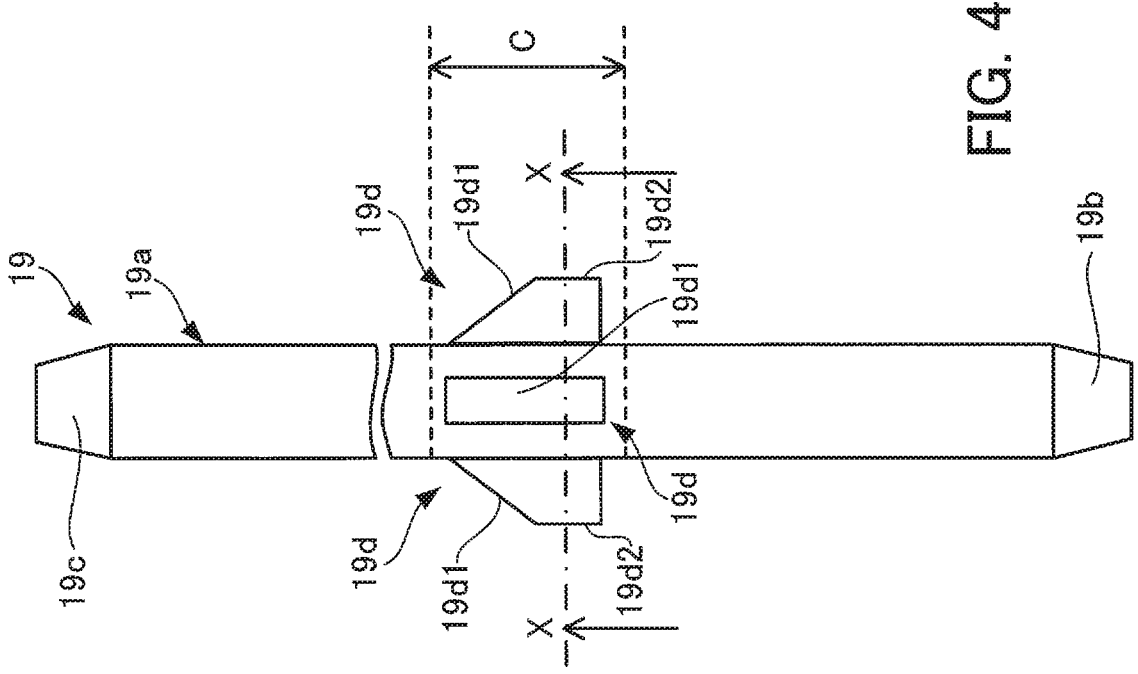

A semiconductor device according to a first embodiment will be described by the use of FIGS. 1 through 4B. FIG. 1 is a sectional view of a semiconductor device according to a first embodiment. Furthermore, FIGS. 2A and 2B are views for describing a ceramic circuit board in the first embodiment. FIGS. 3A and 3B are views for describing a contact part in the first embodiment. FIGS. 4A and 4B are views for describing an external connection terminal in the first embodiment. FIG. 2A is a plan view of a ceramic circuit board 14 and FIG. 2B is a sectional view taken along the dot-dash line X-X of FIG. 2A. FIG. 3A is a plan view of a contact part 17 and FIG. 3B is a sectional view taken along the dot-dash line X-X of FIG. 3A. FIG. 4A is a front view of an external connection terminal 19 and FIG. 4B is a sectional view taken along the dot-dash line X-X of FIG. 4A.

As illustrated in FIG. 1, the semiconductor device 10 includes the ceramic circuit board 14 and semiconductor chips 15 and the contact parts 17 arranged over the ceramic circuit board 14. Furthermore, the semiconductor device 10 includes a sheath case 20 which houses these parts. In addition, the semiconductor device 10 includes the external connection terminals 19. A lower end portion of each external connection terminal 19 is press-fitted into a contact part 17 and part of an upper end portion of each external connection terminal 19 extends from the sheath case 20. Moreover, the semiconductor device 10 includes a printed-circuit board 50 fixed to the external connection terminals 19 extending from the sheath case 20.

The ceramic circuit board 14 has the shape of a plate. Its front surface which faces the inside of the semiconductor device 10 and its back surface which faces the outside of the semiconductor device 10 are principal planes. Furthermore, the ceramic circuit board 14 includes an insulating plate 11, a radiation plate 12 formed under the back surface of the insulating plate 11, and conductive plates 13 formed over the front surface of the insulating plate 11. The semiconductor chips 15 are bonded to the conductive plates 13 with solder 16 therebetween. In addition, the contact parts 17 are bonded to the conductive plates 13 with the solder 16 therebetween.

The conductive plates 13 of the ceramic circuit board 14 and electrodes formed over the front surfaces of the semiconductor chips 15 are electrically connected by wiring members such as bonding wires 18. The conductive plates 13 are electrically connected by wiring members such as bonding wires 18. The electrodes formed over the front surfaces of the semiconductor chips 15 are electrically connected by wiring members such as bonding wires 18. As a result, the semiconductor chips 15 and the contact parts 17 are electrically connected via the bonding wires 18, the conductive plates 13, and the like.

As illustrated in FIGS. 2A and 2B, the above ceramic circuit board 14 includes the insulating plate 11, the radiation plate 12 formed under the back surface of the insulating plate 11, and the conductive plates 13 formed over the front surface of the insulating plate 11. The insulating plate 11 is made of a ceramic, such as aluminum oxide, aluminum nitride, or silicon nitride, having high thermal conductivity. The radiation plate 12 is made of metal, such as aluminum, iron, silver, copper, or an alloy containing at least one of them, having high thermal conductivity. The conductive plates 13 are made of metal, such as copper or a copper alloy, having good electrical conductivity. The number or shape of the conductive plates 13 is taken as an example. Any number of conductive plates 13 may be used or the conductive plates 13 may have any shape. Furthermore, circles drawn on the conductive plates 13 by a dashed line indicate the arrangement positions of the contact parts 17. Rectangles drawn on the conductive plates 13 by a dashed line indicate the arrangement positions of the semiconductor chips 15. However, the arrangement positions of the contact parts 17 or the semiconductor chips 15 are taken as an example and are not limited to those illustrated in FIG. 2A. A direct copper bonding (DCB) substrate, an active metal brazed (AMB) substrate, or the like may be used as the ceramic circuit board 14 having the above structure.

Furthermore, a base plate (not illustrated) may be arranged under the back surface of the ceramic circuit board 14 with solder, silver solder, or the like therebetween. The base plate is made of aluminum, iron, silver, copper, an alloy containing at least one of them, or the like having high thermal conductivity. In addition, in order to improve the corrosion resistance of the base plate, a material, such as nickel, may be formed on the surface of the base plate by plating treatment or the like. Moreover, a cooler (not illustrated) may be fixed to the back surface of the radiation plate 12 to improve the heat dissipation property. The cooler is made of aluminum, iron, silver, copper, an alloy containing at least one of them, or the like having high thermal conductivity. Furthermore, a fin, a heat sink made up of a plurality of fins, a water-cooling cooler, or the like may be used as the cooler. In addition, the base plate and the cooler may be integrally formed. In that case, the base plate and the cooler are made of aluminum, iron, silver, copper, or an alloy containing at least one of them having high thermal conductivity. Moreover, in order to improve corrosion resistance, a material, such as nickel, may be formed on the surface of the base plate integrated with the cooler by plating treatment or the like.

A semiconductor chip 15 includes a switching element, such as an IGBT or a power MOSFET, made of silicon or silicon carbide. For example, such a semiconductor chip 15 has a drain electrode (or a collector electrode) as a main electrode on the back surface and has a gate electrode and a source electrode (or an emitter electrode) as main electrodes on the front surface. Furthermore, a semiconductor chip 15 includes a diode, such as a Schottky barrier diode (SBD) or a freewheeling diode (FWD), at need. Such a semiconductor chip 15 has a cathode electrode as a main electrode on the back surface and has an anode electrode as a main electrode on the front surface. An electronic part, such as a resistor, a thermistor, a capacitor, or a surge absorber, may be arranged at need in addition to the semiconductor chips 15.

As illustrated in FIGS. 3A and 3B, the contact part 17 has a body portion 17a in which a cylindrical penetration hole 17b is made and flanges 17c1 and 17c2 formed on open end portions 17b1 and 17b2, respectively, of the body portion 17a. Furthermore, in this example, the flanges 17c1 and 17c2 are formed on both of the open end portions 17b1 and 17b2. However, a flange may be formed only on one of the open end portions 17b1 and 17b2. The contact part 17 is made of aluminum, iron, silver, copper, or an alloy containing at least one of them having good electrical conductivity. In addition, in order to improve the corrosion resistance of the contact part 17, metal, such as nickel or gold, may be formed on the surface of the contact part 17 by plating treatment or the like. To be concrete, a nickel-phosphorus alloy, nickel-boron alloy, or the like other than nickel and gold may be used. Moreover, gold may be laminated over a nickel-phosphorus alloy. With the contact part 17 having the above structure, the inside diameter D of the penetration hole 17b at the open end portions 17b1 and 17b2 is preferably larger than or equal to 0.3 mm and smaller than or equal to 5.0 mm and is more preferably larger than or equal to 0.6 mm and smaller than or equal to 2.5 mm. In addition, the height of the contact part 17 is preferably greater than or equal to 1.0 mm and smaller than or equal to 7.0 mm and is more preferably greater than or equal to 2.0 mm and smaller than or equal to 5.0 mm.

The bonding wires 18 are made of metal, such as aluminum or copper, an alloy containing at least one of them, or the like having good electrical conductivity. The bonding wires 18 in the semiconductor device 10 are made of copper or a copper alloy. The diameter of the bonding wires 18 is preferably greater than or equal to 100 μm and smaller than or equal to 1 mm.

As illustrated in FIGS. 4A and 4B, the external connection terminal 19 has a body portion 19a, guide portions 19d formed in a position distant from both end portions of the body portion 19a, and taper tip portions 19b and 19c formed on both end portions of the body portion 19a. In particular, the body portion 19a has the shape of a prism and has four sides 19a1. A cross section of the body portion 19a is square. Furthermore, the four corners of the square may be C-chamfered or R-chamfered. In addition, the length L of each side 19a1 of the external connection terminal 19 is greater than or equal to 0.5 mm and smaller than or equal to 2.0 mm. The length of the diagonal is greater than or equal to 0.8 mm and smaller than or equal to 2.7 mm. That is to say, the length of the diagonal is slightly greater than the inside diameter D of the contact part 17. In addition, a guide portion 19d is fixed to an intersection area C of each side 19a1 of the external connection terminal 19. The intersection area C of each side 19a1 of the external connection terminal 19 is a part of the side 19a1 that faces the inner wall surface of an insertion hole 22a formed in a lid plate 22 of the sheath case 20 (see FIG. 1) when the lid plate 22 is fixed with the external connection terminal 19 protruding through the insertion hole 22a. That is, when the external connection terminal 19 is inserted into the insertion hole 22a in the lid plate 22 of the sheath case 20, the intersection area C of each side 19a1 is housed in the insertion hole 22a. Each guide portion 19d has an inclined surface 19d1 and an outer surface 19d2 and has the shape of a wedge. When the external connection terminal 19 is inserted into the insertion hole 22a in the lid plate 22 (see FIG. 1), the inclined surface 19d1 is inclined to the center of the external connection terminal 19 from an entrance 22b to an exit 22c of the insertion hole 22a. Accordingly, when the external connection terminal 19 is inserted into the insertion hole 22a in the lid plate 22 (see FIG. 1), the inclined surface 19d1 is inclined to the external connection terminal 19 with respect to the direction in which the external connection terminal 19 is inserted into the insertion hole 22a. The outer surface 19d2 is parallel with the direction in which the external connection terminal 19 is inserted into the insertion hole 22a. The body portion 19a, the guide portions 19d, and the tip portions 19b and 19c may integrally be formed. The above external connection terminal 19 is formed by press-molding a rod-shaped member. Moreover, the external connection terminal 19 is made of aluminum, iron, silver, copper, or an alloy containing at least one of them having good electrical conductivity. Furthermore, in order to improve the corrosion resistance of the external connection terminal 19, metal, such as nickel or tin, may be formed on the surface of the external connection terminal 19 by plating treatment or the like.

The sheath case 20 houses the front surface of the ceramic circuit board 14, the semiconductor chips 15, the contact parts 17, and the lower end portions of the external connection terminals 19. The sheath case 20 has a sidewall 21 and the lid plate 22. The sidewall 21 has, in planar view, the shape of a box which surrounds surroundings of the ceramic circuit board 14. The back surface of the sidewall 21 is fixed to a peripheral edge portion of the ceramic circuit board 14 with an adhesive (not illustrated) therebetween. The lid plate 22 has the shape of a flat plate and is arranged so as to cover an aperture portion of the sidewall 21. The lid plate 22 is arranged horizontally with respect to the principal plane of the ceramic circuit board 14 opposite the principal plane of the ceramic circuit board 14. Furthermore, when the sheath case 20 is arranged with respect to the ceramic circuit board 14, the insertion holes 22a are made in planar view in the lid plate 22 at positions corresponding to the external connection terminals 19. In addition, the insertion holes 22a are made in planar view in the lid plate 22 at positions corresponding to the contact parts 17. The insertion holes 22a pierce the entrances 22b on the back surface of the lid plate 22 and the exits 22c on the front surface of the lid plate 22 opposite the entrances 22b. The external connection terminals 19 are inserted into the insertion holes 22a made in this way. In the first embodiment the entrances 22b and the exits 22c are equal in diameter. For example, the diameter of the entrances 22b and the exits 22c is larger than or equal to 1.0 mm and smaller than or equal to 3.0 mm. The external connection terminals 19 inserted in this way into the insertion holes 22a in the lid plate 22 come in contact with inner wall surfaces 22d of the insertion holes 22a. Frictional force between the external connection terminals 19 and the inner wall surfaces 22d of the insertion holes 22a is weaker than fitting force between the contact parts 17 and the external connection terminals 19. The sidewall 21 of the sheath case 20 and the lid plate 22 may integrally be formed. The sheath case 20 is made of a thermoplastic resin such as polyphenylene sulfide (PPS), polybutylene terephthalate (PBT) resin, polybutylene succinate (PBS) resin, polyamide (PA) resin, or acrylonitrile butadiene styrene (ABS) resin. Furthermore, it is desirable to seal the inside of the sheath case 20 by a sealing resin (not illustrated). For example, a sealing member may be silicone gel. In addition, for example, a thermosetting resin, such as epoxy resin, phenolic resin, or maleimide resin, or a filler included in a thermosetting resin may be used.

Furthermore, fitting holes into which the external connection terminals 19 are fitted are made in the printed-circuit board 50. The printed-circuit board 50 includes an insulating plate and a circuit pattern formed on the front surface of the insulating plate. When the external connection terminals 19 are fitted into the fitting holes in the printed-circuit board 50, the external connection terminals 19 are electrically connected to the circuit pattern. With this printed-circuit board 50 a control current and a principal current for input or output flow via the external connection terminals 19. Furthermore, a control integrated circuit (IC) and the like may be mounted at need over the printed-circuit board 50 to form a control circuit. Electronic parts, such as a resistor, a thermistor, a capacitor, and a surge absorber, may be mounted in place of or in addition to the control IC.

Figure 5:
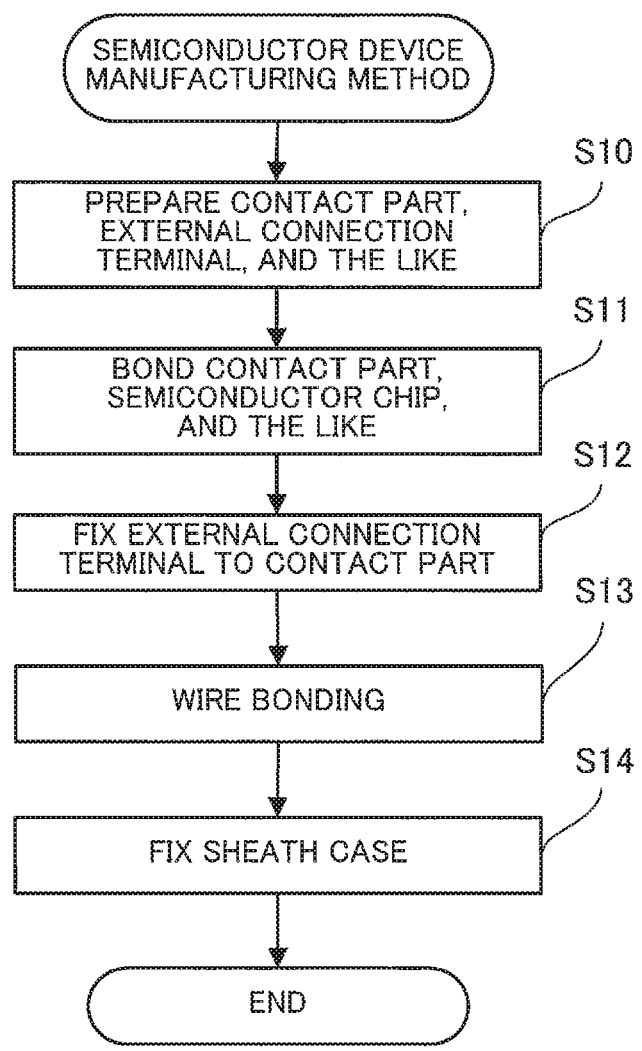
FIG. 5 is a flow chart illustrative of a process for manufacturing the semiconductor device according to the first embodiment.

An example of a method for manufacturing the above semiconductor device 10 will now be described by the use of FIG. 5. FIG. 5 is a flow chart illustrative of a process for manufacturing the semiconductor device according to the first embodiment. The process of FIG. 5 described below is performed artificially, mechanically, or artificially and mechanically.

(Step S10) Components, such as a ceramic circuit board 14, semiconductor chips 15, a contact part 17, and an external connection terminal 19, of the semiconductor device 10 are prepared.

(Step S11) The contact part 17 is bonded to a determined position on a conductive plate 13 of the ceramic circuit board 14 with solder 16 therebetween. Furthermore, at this time a semiconductor chip 15 is bonded to a determined position on a conductive plate 13 with solder 16 therebetween. For example, the solder 16 is Pb-free solder containing at least one of a tin-silver-copper alloy, a tin-zinc-bismuth alloy, a tin-copper alloy, and a tin-silver-indium-bismuth alloy as a main ingredient. In addition, the solder 16 may contain an additive such as nickel, germanium, cobalt, or silicon.

(Step S12) The external connection terminal 19 is inserted from above (from the side of the front surface of the ceramic circuit board 14 inside the semiconductor device 10) into the contact part 17 bonded over the ceramic circuit board 14 in step S11 and a lower end portion of the external connection terminal 19 is fixed to the contact part 17 by press-fitting. At this time it is desirable that there be a vacant space between the lower end portion of the external connection terminal 19 and the ceramic circuit board 14 and the solder 16.

(Step S13) Conductive plates 13 are properly connected by bonding wires 18 and the conductive plates 13 and the semiconductor chips 15 are properly connected by bonding wires 18, over the ceramic circuit board 14 over which the external connection terminal 19 is press-fitted in this way into the contact part 17. After wire bonding, a base plate may be fixed at need to the back surface of the ceramic circuit board 14 with solder, silver solder, or the like therebetween. Alternatively, a cooler (not illustrated) may be fixed onto the back surface of a radiation plate 12 to improve the heat dissipation property. Step S13 may be performed before step S12.

Figure 6:
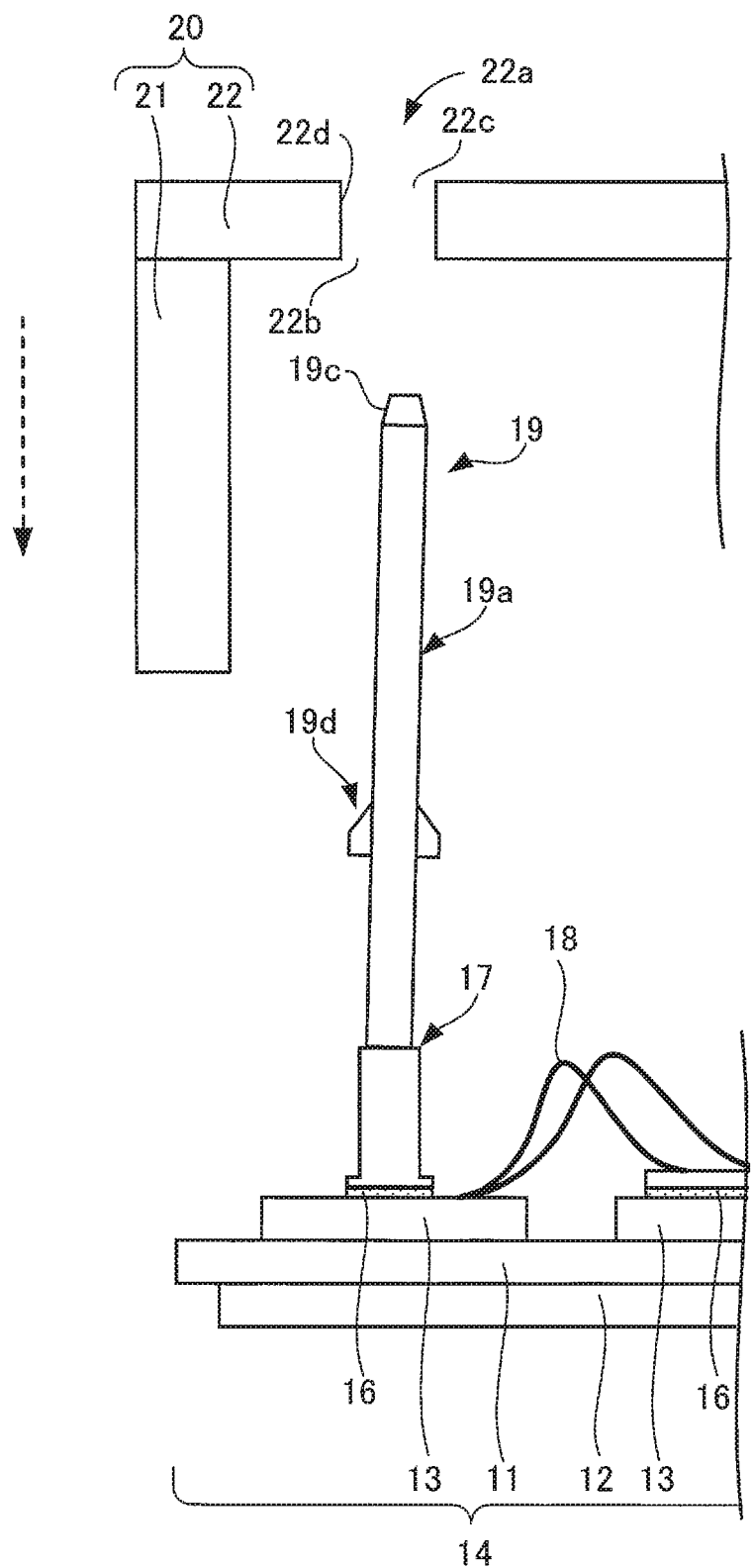
FIG. 6 is a view for describing the step of fixing a case to the ceramic circuit board in the first embodiment (part 1)
Figure 7:
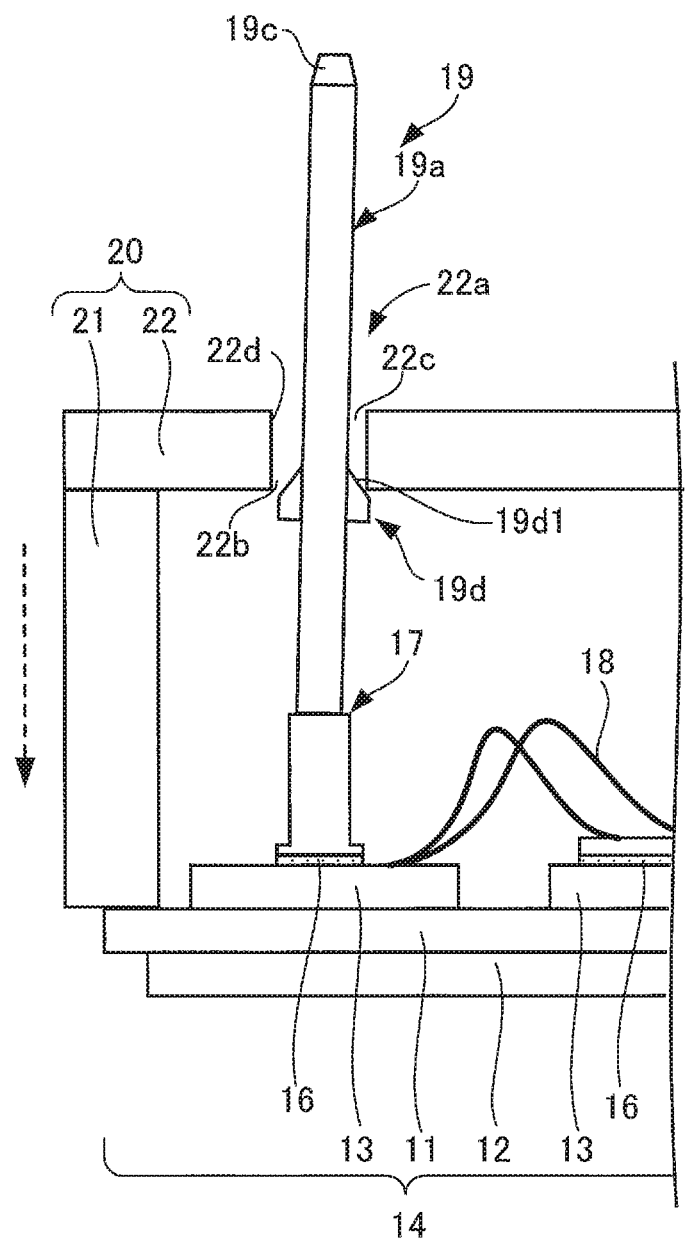
FIG. 7 is a view for describing the step of fixing a case to the ceramic circuit board in the first embodiment (part 2)
Figure 8:
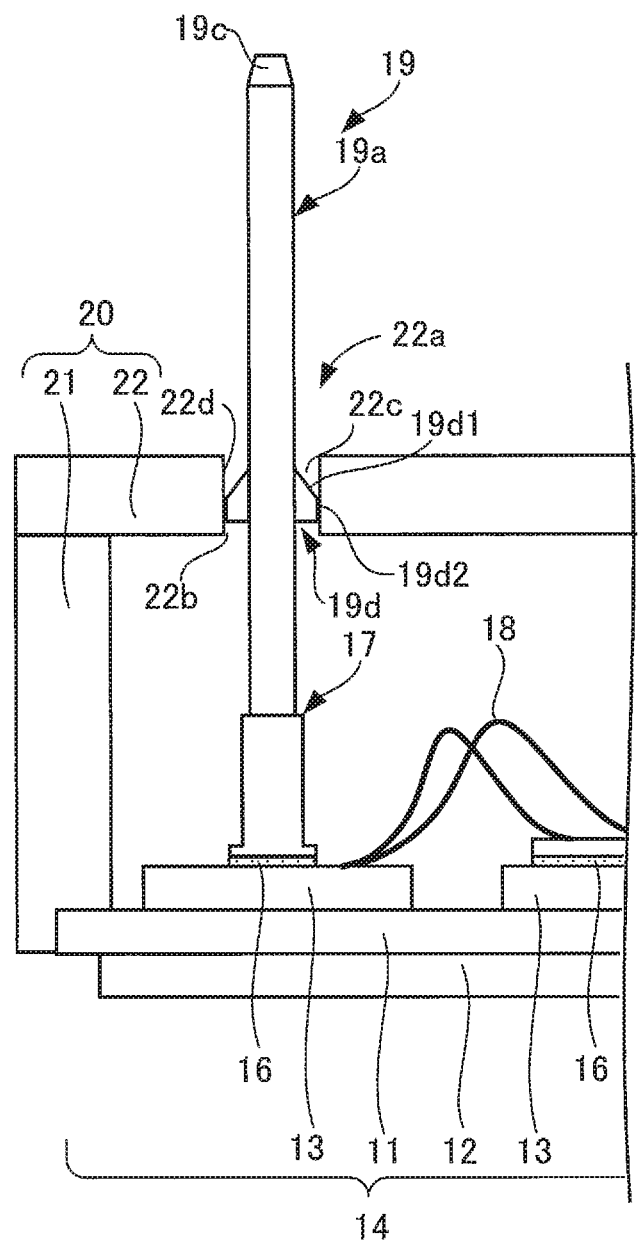
FIG. 8 is a view for describing the step of fixing a case to the ceramic circuit board in the first embodiment (part 3)
Figure 9B:
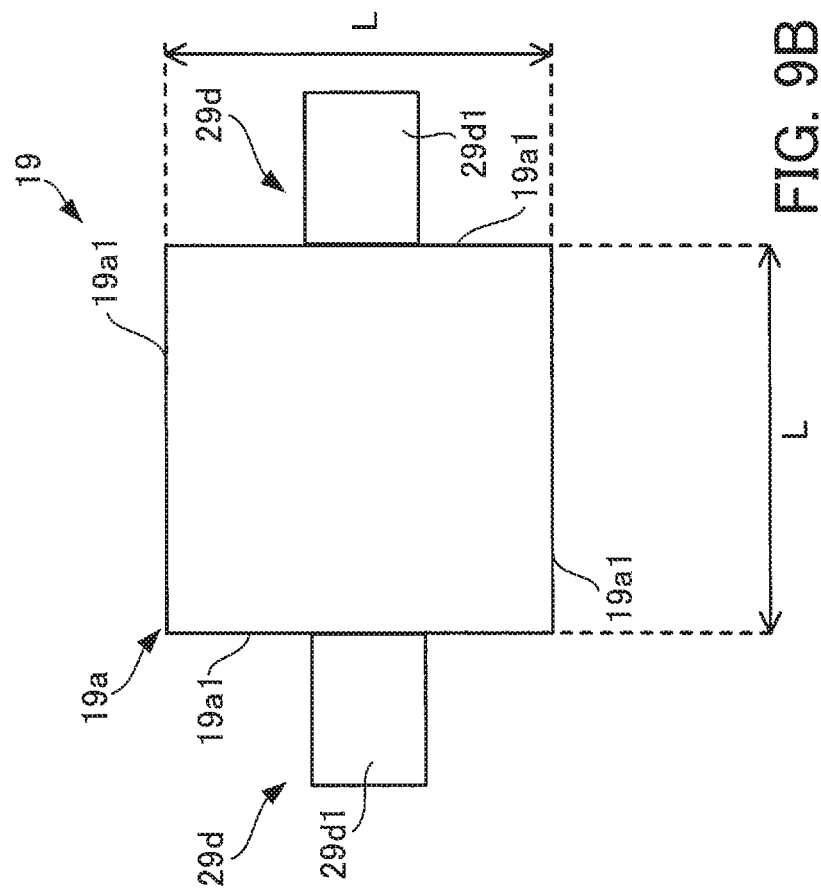
FIGS. 9A and 9B are views for describing another external connection terminal in the first embodiment (part 1)
Figure 9A:
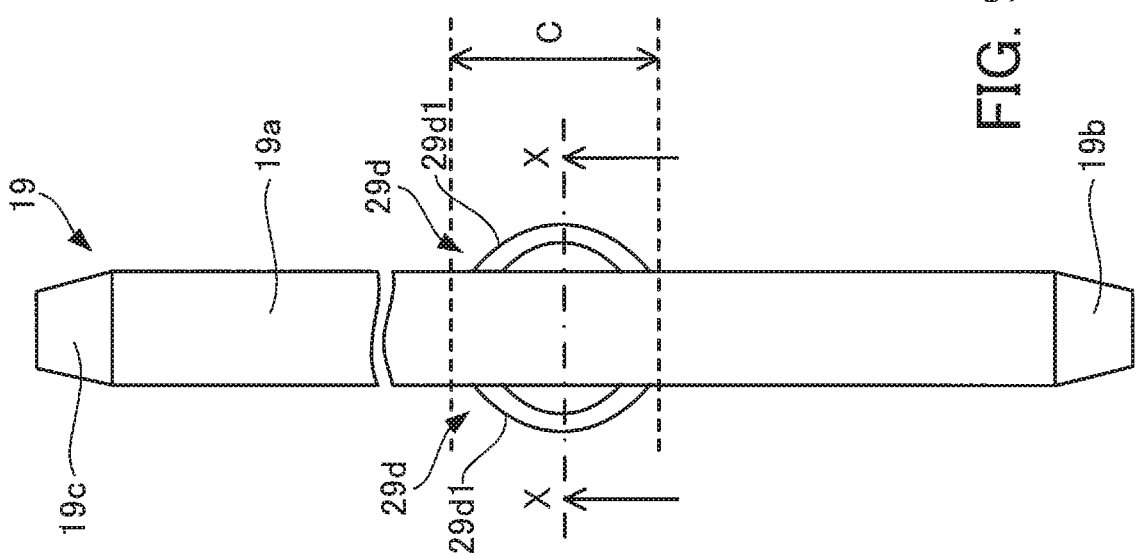

(Step S14) A sheath case 20 is fixed to the ceramic circuit board 14 to which the external connection terminal 19 and the like are fixed by step S13. Furthermore, this fixing step will concretely be described by the use of FIGS. 6 through 8. FIGS. 6 through 8 are views for describing the step of fixing the case to the ceramic circuit board in the first embodiment. FIGS. 6 through 8 illustrate the left part of the sectional view of FIG. 1. For example, it is assumed that when or after the external connection terminal 19 is press-fitted in step S11 into the contact part 17, the contact part 17 or the external connection terminal 19 slightly inclines due to a warp of the ceramic circuit board 14, the slope of a soldering jig of the contact part 17, the slope of the external connection terminal 19 at insertion time, or the like.

First the sheath case 20 is set so that an entrance 22b to an insertion hole 22a in a lid plate 22 of the sheath case 20 will be opposed to the external connection terminal 19 (see FIG. 6). Next, the external connection terminal 19 is made to enter through the entrance 22b to the insertion hole 22a in the lid plate 22. Furthermore, the sheath case 20 is lowered until the entrance 22b to the insertion hole 22a in the lid plate 22 comes in contact with a guide portion 19d of the external connection terminal 19 (see FIG. 7). At this time the external connection terminal 19 inclines. Accordingly, an inclined surface 19d1 of the guide portion 19d comes in contact with the entrance 22b to the insertion hole 22a in the lid plate 22. Next, when the sheath case 20 is lowered further, the inclined surface 19d1 of the guide portion 19d of the external connection terminal 19 slides on the entrance 22b to the insertion hole 22a in the lid plate 22. As a result, the external connection terminal 19 is guided so as to be perpendicular to the ceramic circuit board 14. Furthermore, an outer surface 19d2 of the guide portion 19d comes in contact with an inner wall surface 22d of the insertion hole 22a in the lid plate 22 and the lid plate 22 is fixed to the external connection terminal 19 (see FIG. 8). In the first embodiment the external connection terminal 19 inclines to the right in FIG. 6. However, even if the external connection terminal 19 inclines in any direction, the external connection terminal 19 is guided in the same way so as to be perpendicular to the ceramic circuit board 14. The sheath case 20 is fixed in this way to the ceramic circuit board 14 (see FIG. 1) and the inside is filled with a sealing resin to perform sealing.

The above semiconductor device 10 includes the semiconductor chips 15 and the ceramic circuit board 14 having the conductive plates 13 over whose front surfaces the semiconductor chips 15 are arranged and the insulating plate 11 over whose front surface the conductive plates 13 are formed. Furthermore, the semiconductor device 10 includes the cylindrical contact parts 17 arranged over the conductive plates 13 with the solder 16 therebetween and the rod-shaped external connection terminals 19 whose lower end portions are fitted (press-fitted) into the contact parts 17. In addition, the semiconductor device 10 includes the lid plate 22 having the shape of a flat plate. The external connection terminals 19 are inserted from the entrances 22b to the exits 22c into the insertion holes 22a which pierce the entrances 22b on the back surface of the lid plate 22 opposite the principal plane of the ceramic circuit board 14 and the exits 22c on the front surface of the lid plate 22 opposite the entrances 22b. In this case, each external connection terminal 19 has an inclined surface 19d1 in the intersection area C of each side 19a1 housed in the insertion hole 22a. The inclined surface 19d1 is inclined to the external connection terminal 19 with respect to the direction in which the external connection terminal 19 is inserted into the insertion hole 22a. If the contact part 17 is fixed in a state in which it inclines with respect to the principal plane of the ceramic circuit board 14, then the external connection terminal 19 also inclines. When this external connection terminal 19 is inserted into the insertion hole 22a in the lid plate 22, the external connection terminal 19 is guided perpendicularly to the principal plane of the ceramic circuit board 14 by the inclined surface 19*d*1 of the guide portion 19*d* and the lid plate 22 is fixed to the external connection terminal 19. Therefore, the external connection terminal 19 protruding from the lid plate 22 of the sheath case 20 is fixed to a proper position on a printed-circuit board and assemblability is improved. In addition, if the sheath case 20 is fixed in this way, then the lower end portion and upper end portion of the external connection terminal 19 are supported by the contact part 17 and the lid plate 22 respectively. That is to say, the external connection terminal 19 is supported at the two points. This prevents the external connection terminal 19 from inclining even when a shock or the like is provided from the outside to the semiconductor device 10. As a result, the perpendicularity of the external connection terminal 19 relative to the ceramic circuit board 14 is maintained. Accordingly, when the external connection terminal 19 is fitted into a fitting hole 51 in the printed-circuit board 50 and collides with the back surface or the like of the printed-circuit board 50 other than the fitting hole 51, the external connection terminal 19 does not incline and is kept perpendicular to the ceramic circuit board 14. As a result, workability is improved when the printed-circuit board 50 is fixed.

Another shape of the guide portion 19*d* formed on the external connection terminal 19 will be described by the use of FIGS. 9A and 9B and FIGS. 10A and 10B. FIGS. 9A and 9B or FIGS. 10A and 10B are views for describing another external connection terminal in the first embodiment. For example, guide portions 29*d* are formed in an intersection area C of sides 19*a*1 opposite each other of an external connection terminal 19 illustrated in FIGS. 9A and 9B. Each guide portion 29*d* is made of an elastic member having a half-ring shape in side view. Metal or the like is used as such an elastic member. An outer surface of the ring-shaped guide portion 29*d* functions as an inclined surface 29*d*1. If the external connection terminal 19 inclines with respect to a ceramic circuit board 14, the guide portions 29*d* have the same function as the guide portions 19*d* of the external connection terminal 19 have.

Figure 10B:
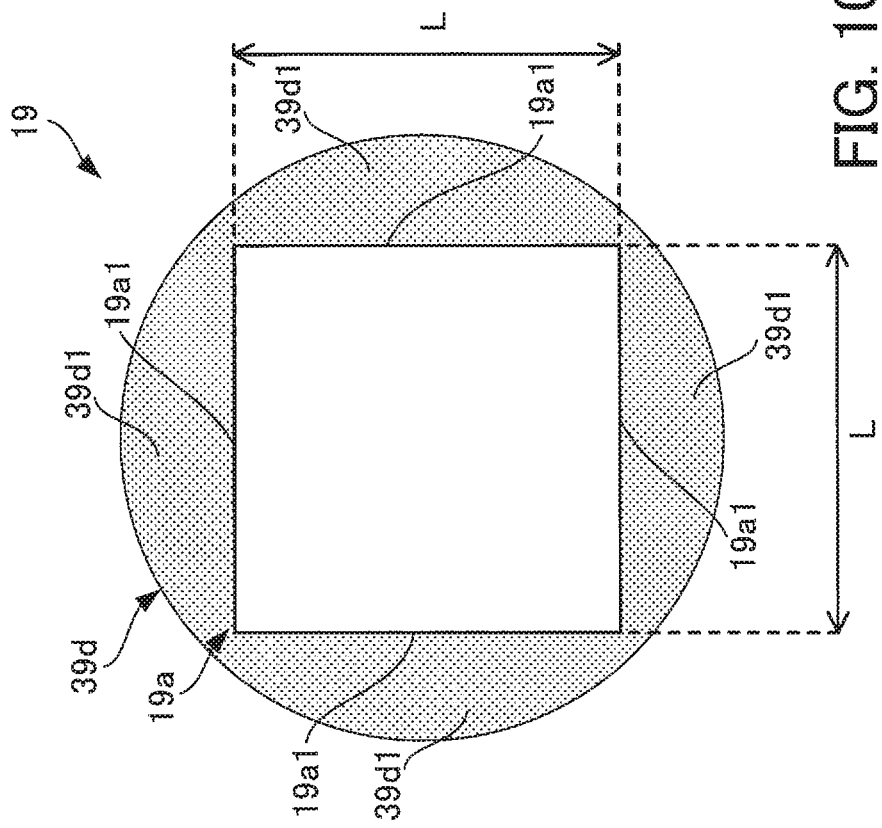
FIGS. 10A and 10B are views for describing another external connection terminal in the first embodiment (part 2)
Figure 10A:
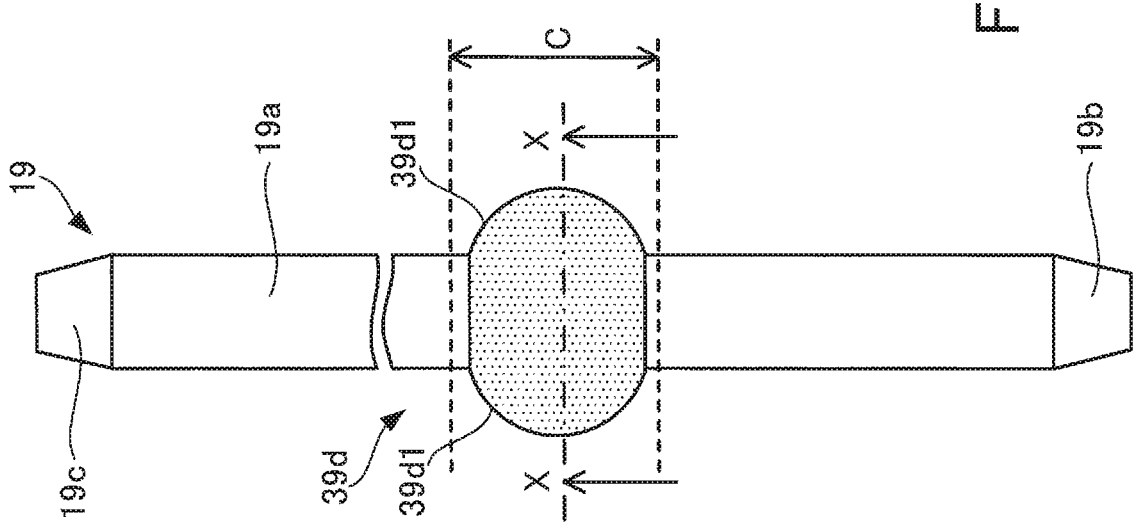

Furthermore, with an external connection terminal 19 illustrated in FIGS. 10A and 10B, a guide portion 39*d* is fixed so as to enclose an intersection area C of sides 19*a*1 housed in an insertion hole 22*a* at the time of a lid plate 22 being fixed. The guide portion 39*d* is made of resin having a round or elliptical shape in side view. Maleimide-modified epoxy resin, maleimide-modified phenolic resin, maleimide resin, or the like is used as such resin. An outer surface of the guide portion 39*d* functions as an inclined surface 39*dl*. If the external connection terminal 19 inclines with respect to a ceramic circuit board 14, the guide portion 39*d* has the same function as the guide portions 19*d* of the external connection terminal 19 have.

Second Embodiment

Figure 11:
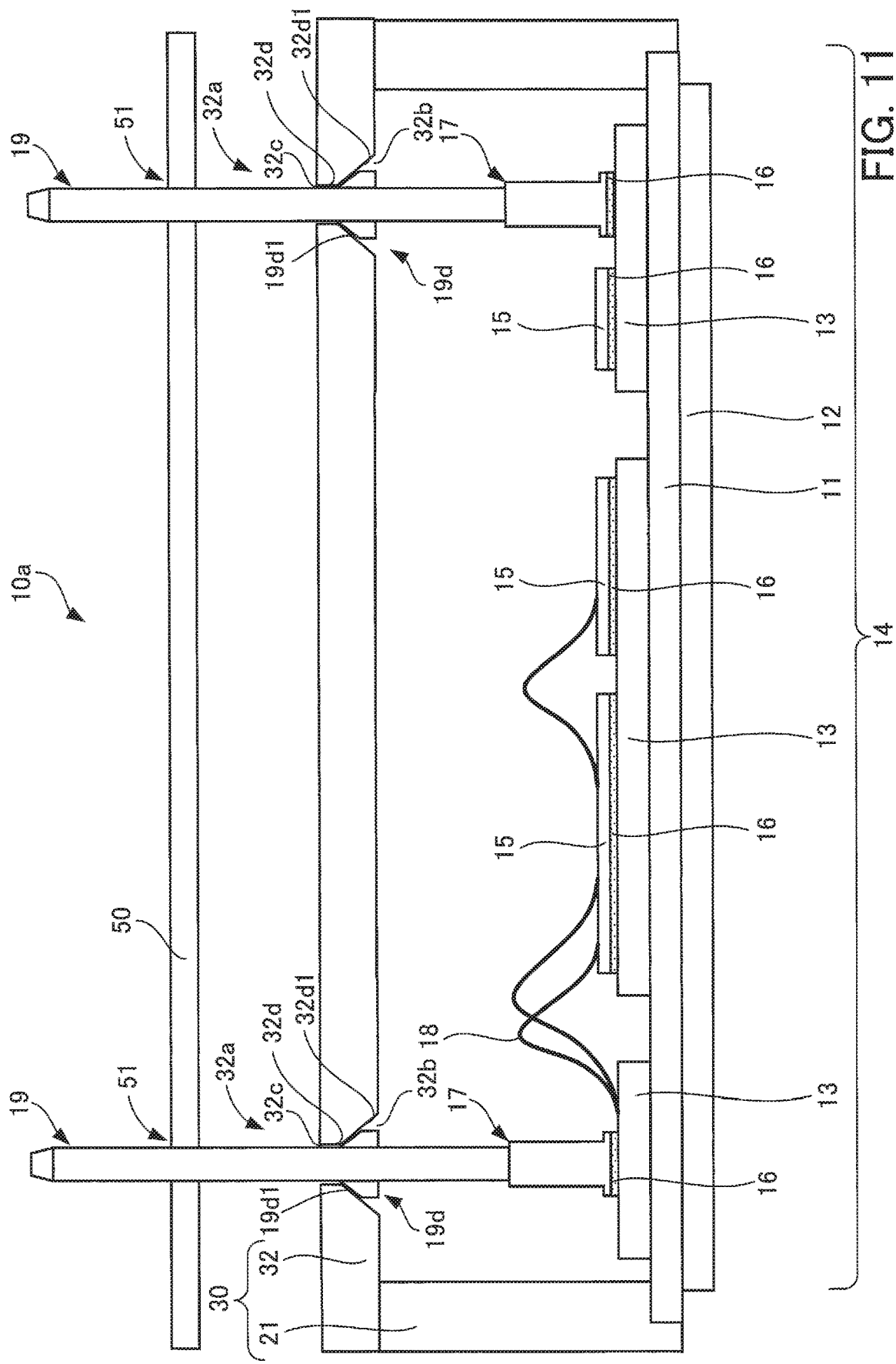
FIG. 11 is a sectional view of a semiconductor device according to a second embodiment.

An insertion hole made in a lid plate in a second embodiment differs from the insertion hole made in the lid plate in the first embodiment. This will be described by the use of FIG. 11. FIG. 11 is a sectional view of a semiconductor device according to a second embodiment. Except for a position in which a lid plate 32 of a sheath case 30 is fixed to a guide portion 19*d* of an external connection terminal 19, the structure of a semiconductor device 10*a* according to a second embodiment is the same as that of the semiconductor device 10 according to the first embodiment. Description of the same components will be omitted.

The semiconductor device 10*a* includes the lid plate 32 in place of the lid plate 22 of the semiconductor device 10 according to the first embodiment. The area of an entrance 32*b* on the back surface to an insertion hole 32*a* made in the lid plate 32 is larger than that of an exit 32*c* on the front surface from the insertion hole 32*a*. Furthermore, the guide portion 19*d* having an inclined surface 19*d*1 is formed in an intersection area C of each side 19*a*1 of the external connection terminal 19 housed in the insertion hole 32*a*. This is the same with the first embodiment (see FIGS. 4A and 4B). In addition, an inner wall surface 32*d* of the insertion hole 32*a* in the lid plate 32 has an inclined surface 32*dl* inclined to the external connection terminal 19 with respect to the direction in which the external connection terminal 19 is inserted into the insertion hole 32*a*. That is to say, the insertion hole 32*a* has a (diameter-reduced) shape in which the diameter becomes smaller from the entrance 32*b* to the exit 32*c* of the lid plate 32. With the insertion hole 32*a* illustrated in FIG. 11, the diameter is reduced from the entrance 32*b* to the exit 32*c* and becomes constant from an intermediate point to the exit 32*c*. With the semiconductor device 10*a* having the above structure, the external connection terminal 19 is inserted from the entrance 32*b* into the insertion hole 32*a* and the inclined surface 19*dl* of the guide portion 19*d* is in contact with the inclined surface 32*dl* of the insertion hole 32*a*. The semiconductor device 10*a* is also manufactured in accordance with steps S10 through S14 of the flow chart illustrated in FIG. 5.

Figure 12:
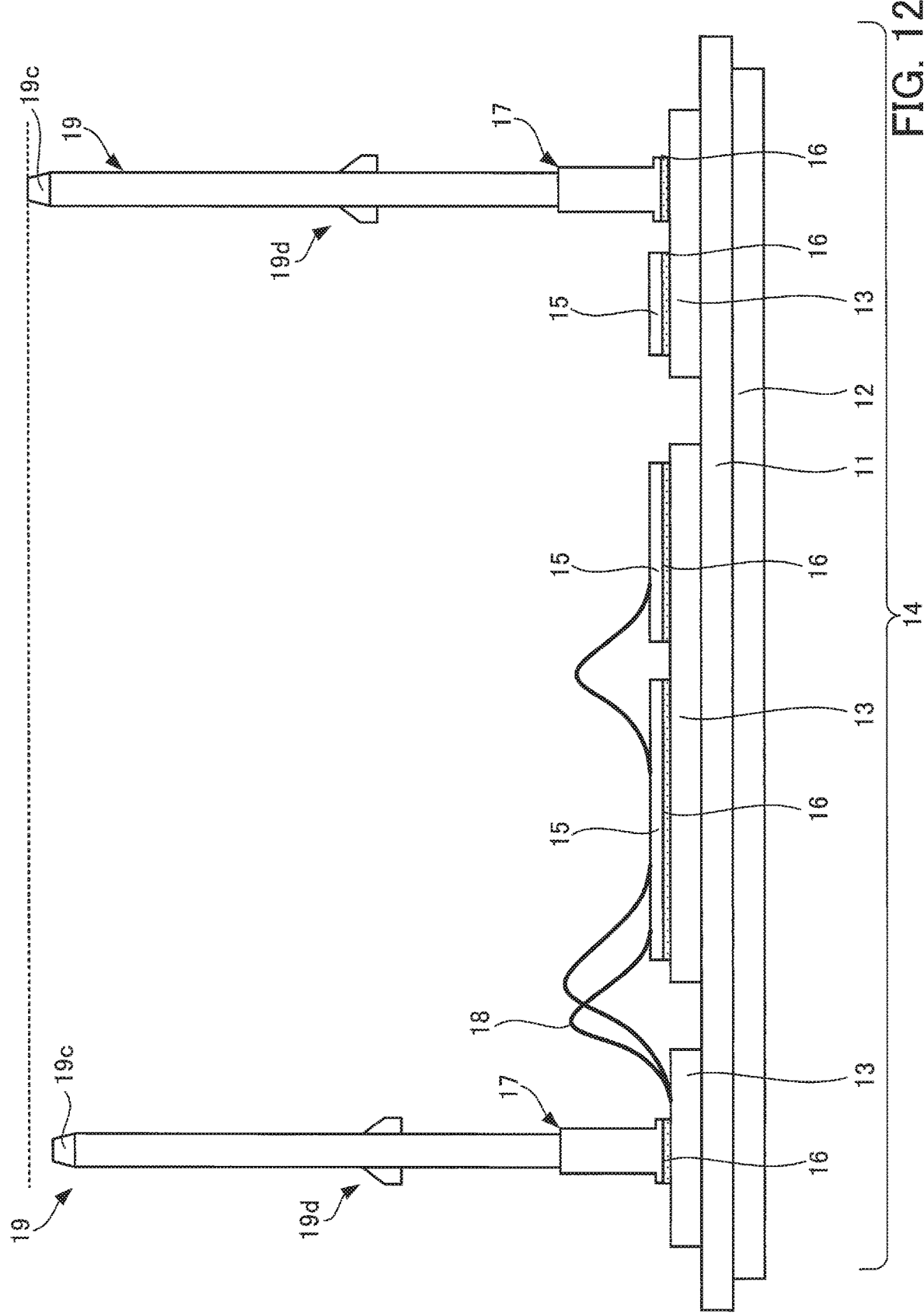
FIG. 12 is a view for describing the step of fixing a case to a ceramic circuit board in the second embodiment (part 1)
Figure 13:
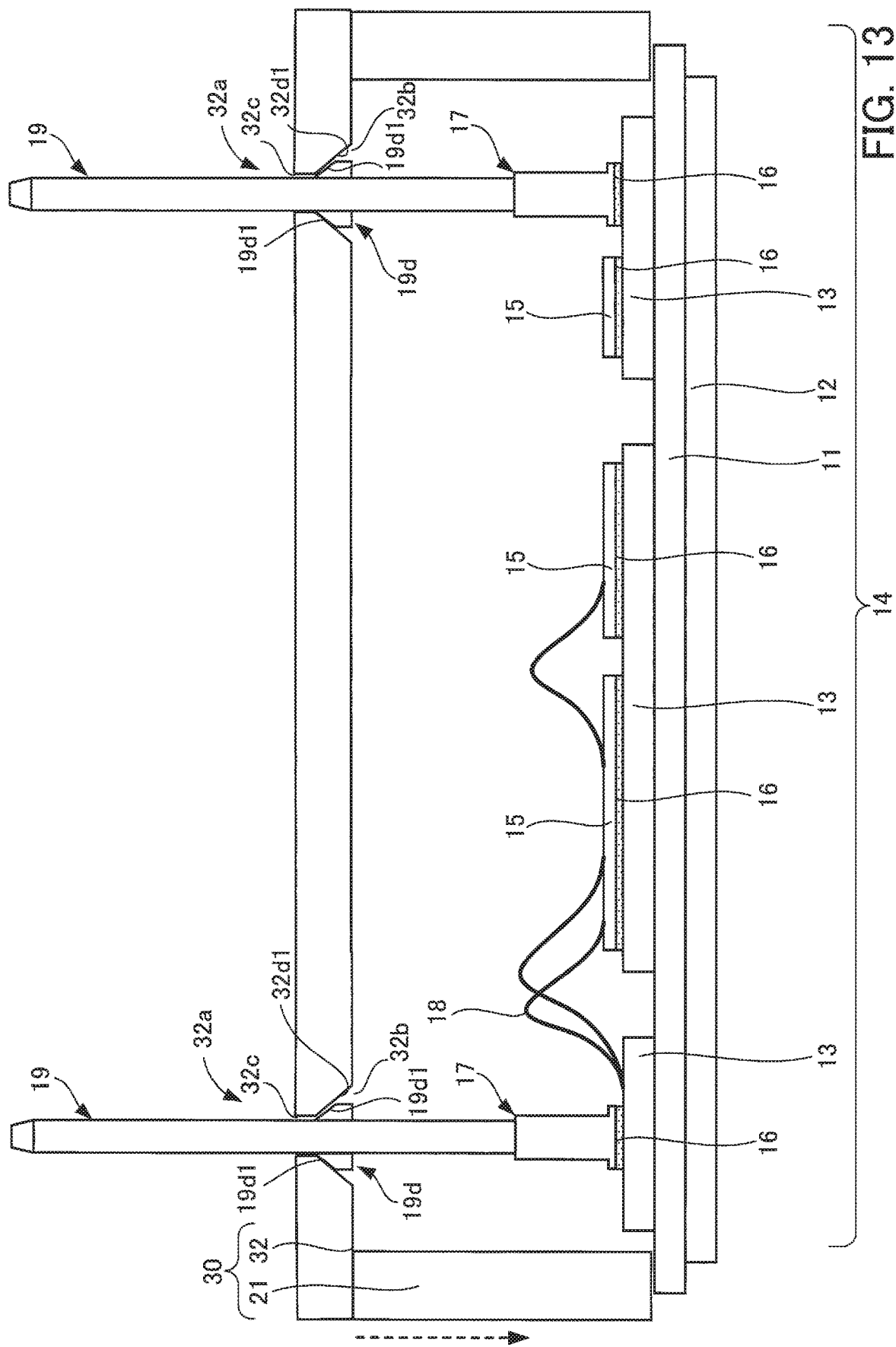
FIG. 13 is a view for describing the step of fixing a case to a ceramic circuit board in the second embodiment (part 2)

The details of step S14 of FIG. 5 described in the first embodiment will now be described by the use of FIGS. 12 and 13. FIGS. 12 and 13 are views for describing the step of fixing a case to a ceramic circuit board in the second embodiment. In the second embodiment steps which are the same as steps S10 through S13 are performed. In the second embodiment the following case will be described. In step S12, the external connection terminals 19 are fitted into contact parts 17. However, an external connection terminal 19 is not properly fitted into a contact part 17 for some reason or other. As illustrated in FIG. 12, for example, the external connection terminals 19 differ in height. With the external connection terminal 19 having a tip portion 19*c* whose position is higher than that of a tip portion 19*c* of the other external connection terminal 19 (with the right external connection terminal 19 in FIG. 12), at this time there is a vacant space between its (lower) tip portion 19*b* (not illustrated in FIG. 12) and a ceramic circuit board 14 and solder 16.

In step S14, the sheath case 30 is fixed to the ceramic circuit board 14 over which the external connection terminals 19 and the like are fixed. This is the same with the first embodiment. In this fixing step, first the sheath case 30 is set so that the entrance 32*b* to the insertion hole 32*a* in the lid plate 32 of the sheath case 30 will be opposed to the external connection terminal 19. Next, the sheath case 30 is lowered to the ceramic circuit board 14 to make the external connection terminal 19 enter through the entrance 32*b* to the insertion hole 32*a* in the lid plate 32. As a result, the inclined surface 19*d*1 of the guide portion 19*d* of the external connection terminal 19 comes in contact with the inclined surface 32*d*1 of the insertion hole 32*a* in the lid plate 32. When the sheath case 30 is lowered further to the ceramic circuit board 14 in this state, the inclined surface 32*d*1 of the insertion hole 32*a* in the lid plate 32 comes in contact with the inclined surface 19*d*1 of the guide portion 19*d* of the external connection terminal 19 and is put upon the inclined surface 19*d*1. The sheath case (lid plate 32) is pressed further to the ceramic circuit board 14 in this state. By doing so, the external connection terminal 19 not properly fitted into the contact part 17 is made equal in height to the other external connection terminal 19 (see FIG. 13). The sheath case 30 is lowered further to the ceramic circuit board 14 to fix the sheath case 30 to the ceramic circuit board 14 (see FIG. 11).

The above semiconductor device 10a includes semiconductor chips 15 and the ceramic circuit board 14 having conductive plates 13 over whose front surfaces the semiconductor chips 15 are arranged and an insulating plate 11 over whose front surface the conductive plates 13 are formed. Furthermore, the semiconductor device 10a includes the cylindrical contact parts 17 arranged over the conductive plates 13 with the solder 16 therebetween and the rod-shaped external connection terminals 19 whose lower end portions are fitted into the contact parts 17. In addition, the semiconductor device 10a includes the lid plate 32 having the shape of a flat plate. The external connection terminals 19 are inserted from the entrances 32b to the exits 32c into the insertion holes 32a which pierce the entrances 32b on the back surface of the lid plate 32 opposite the principal plane of the ceramic circuit board 14 and the exits 32c on the front surface of the lid plate 32 opposite the entrances 32b. In this case, each external connection terminal 19 has an inclined surface 19d1 in the intersection area C of each side 19a1 housed in the insertion hole 32a. The inclined surface 19d1 is inclined to the external connection terminal 19 with respect to the direction in which the external connection terminal 19 is inserted into the insertion hole 32a. In addition, an inner wall surface 32d of each insertion hole 32a has an inclined surface 32d1 inclined to the external connection terminal 19 with respect to the direction in which the external connection terminal 19 is inserted into the insertion hole 32a. When the external connection terminals 19 fitted into the contact parts 17 and different in height are inserted into the insertion holes 32a in the lid plate 32, the inclined surfaces 19d1 of the guide portions 19d of the external connection terminals 19 are pressed by the inclined surfaces 32d1 of the insertion holes 32a in the lid plate 32. As a result, the external connection terminals 19 are pressed against the contact parts 17 and are made equal in height. Furthermore, the inclined external connection terminal 19 is guided perpendicularly to the principal plane of the ceramic circuit board 14 by the inclined surface 32d1 of the insertion hole 32a in the lid plate 32. This is the same with the first embodiment. Accordingly, the external connection terminals 19 are press-fitted into the contact parts 17 by proper fitting force and each external connection terminal 19 protruding from the lid plate 32 of the sheath case 30 is fixed to a proper position on a printed-circuit board 50. As a result, assemblability is improved. In addition, in this case, a tip portion 19b and a tip portion 19c of each external connection terminal 19 are supported by a contact part 17 and the lid plate 32 respectively. That is two say, each external connection terminal 19 is supported at the two points. As a result, the perpendicularity of each external connection terminal 19 relative to the ceramic circuit board 14 is maintained. Accordingly, workability is improved when the printed-circuit board 50 is fixed to each external connection terminal 19.

The guide portions 19d of the external connection terminals 19 do not always need the outer surfaces 19d2. That is to say, each guide portion 19d may have the shape of a triangular wedge and include an inclined surface 19d1, in side view. Furthermore, for example, an inclined surface 32d1 of an inner wall surface 32d of each insertion hole 32a in the lid plate 32 may have a shape like an inclined surface 42d1 described later in FIG. 14. That is to say, an entrance 32b and an exit 32c directly connect.

Third Embodiment

Figure 14:
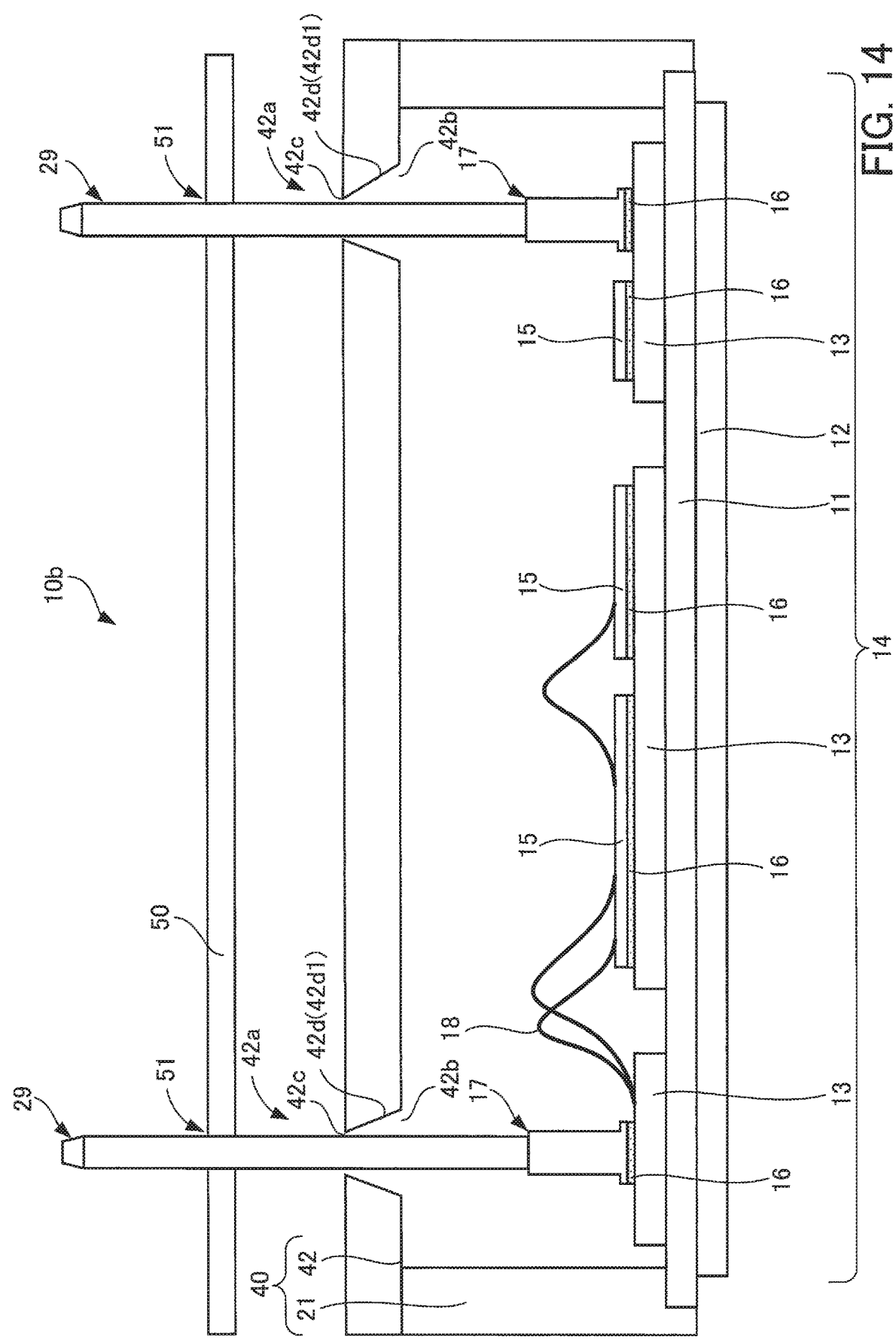
FIG. 14 is a sectional view of a semiconductor device according to a third embodiment.

A third embodiment differs from the first embodiment in that a guide portion 19d is not formed on each external connection terminal 19 and in that an inclined surface 42dl is formed in each insertion hole 42a in a lid plate 42. This case will be described by the use if FIG. 14. FIG. 14 is a sectional view of a semiconductor device according to a third embodiment. Except for the lid plate 42 of a sheath case 40 and an external connection terminal 29, the structure of a semiconductor device 10b according to a third embodiment is the same as that of the semiconductor device 10 according to the first embodiment. Description of the same components will be omitted.

The semiconductor device 10b includes the lid plate 42 in place of the lid plate 22 of the semiconductor device 10 according to the first embodiment. The area of an entrance 42b on the back surface to the insertion hole 42a made in the lid plate 42 is larger than that of an exit 42c on the front surface from the insertion hole 42a. Furthermore, an inner wall surface 42d of the insertion hole 42a is inclined to the external connection terminal 29 with respect to the direction in which the external connection terminal 29 is inserted into the insertion hole 42a. Therefore, the inner wall surface 42d may be referred to as an inclined surface 42d1. That is to say, the insertion hole 42a has a (diameter-reduced) shape in which the diameter becomes smaller from the entrance 42b to the exit 42c of the lid plate 42. The semiconductor device 10b is also manufactured in accordance with steps S10 through S14 of the flow chart illustrated in FIG. 5.

Figure 15:
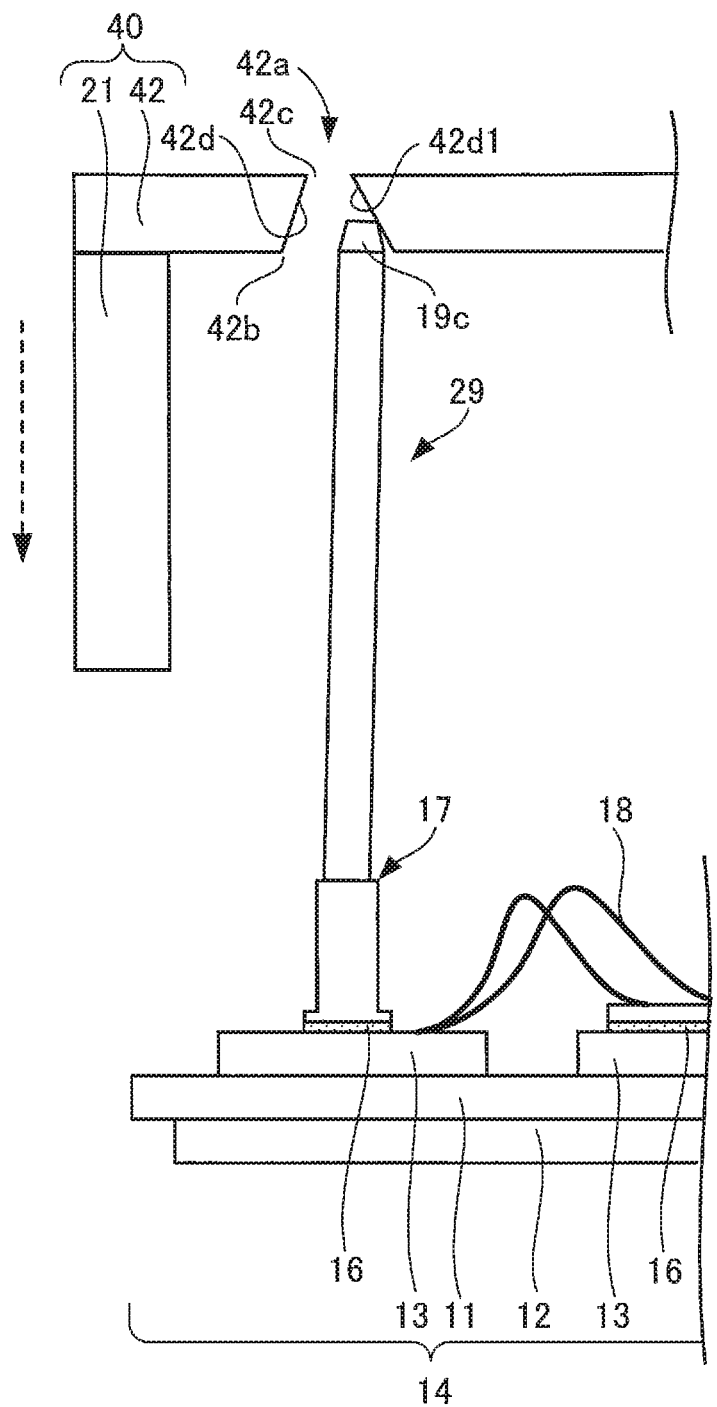
FIG. 15 is a view for describing the step of fixing a case to a ceramic circuit board in the third embodiment (part 1)
Figure 16:
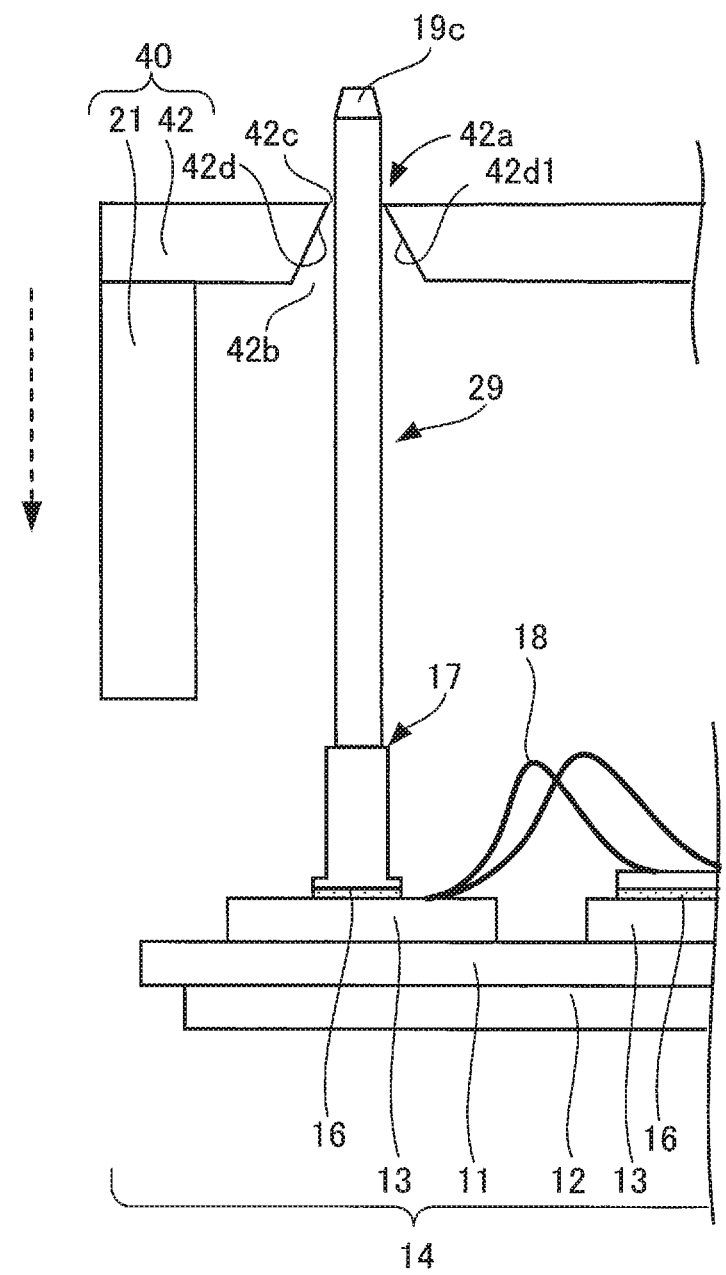
FIG. 16 is a view for describing the step of fixing a case to a ceramic circuit board in the third embodiment (part 2).

The details of step S14 of FIG. 5 in the third embodiment will now be described by the use of FIGS. 15 and 16. FIGS. 15 and 16 are views for describing the step of fixing the case to a ceramic circuit board in the third embodiment. In the third embodiment steps which are the same as steps S10 through S13 are performed. In the third embodiment it is assumed that when or after the external connection terminal 29 is fitted into a contact part 17 in step S12, the contact part 17 slightly inclines for some reason or other.

First the sheath case 40 is set so that the entrance 42b to the insertion hole 42a in the lid plate 42 of the sheath case 40 will be opposed to the external connection terminal 29. Next, the sheath case 40 is lowered to a ceramic circuit board 14 to make the external connection terminal 29 enter through the entrance 42b to the insertion hole 42a in the lid plate 42. As a result, a tip portion 19c of the external connection terminal 29 comes in contact with the inclined surface 42dl in the insertion hole 42a in the lid plate 42 (see FIG. 15). When the sheath case 40 is lowered further to the ceramic circuit board 14 in this state, the tip portion 19c of the external connection terminal 29 is guided to the exit 42c along the inclined surface 42dl in the insertion hole 42a in the lid plate 42. As a result, the external connection terminal 29 is kept perpendicular to the principal plane of the ceramic circuit board 14 and is inserted into the insertion hole 42a (see FIG. 16). The sheath case 40 is lowered further to the ceramic circuit board 14 to fix the sheath case 40 to the ceramic circuit board 14 (see FIG. 14). The inside is filled with a sealing resin to perform sealing.

The above semiconductor device 10b includes semiconductor chips 15 and the ceramic circuit board 14 having conductive plates 13 over whose front surfaces the semiconductor chips 15 are arranged and an insulating plate 11 over whose front surface the conductive plates 13 are formed. Furthermore, the semiconductor device 10b includes the cylindrical contact parts 17 arranged over the conductive plates 13 with solder 16 therebetween and the rod-shaped external connection terminals 29 whose lower end portions are fitted into the contact parts 17. In addition, the semiconductor device 10b includes the lid plate 42 having the shape of a flat plate. The external connection terminals 29 are inserted from the entrances 42b to the exits 42c into the insertion holes 42a which pierce the entrances 42b on the back surface of the lid plate 42 opposite the principal plane of the ceramic circuit board 14 and the exits 42c on the front surface of the lid plate 42 opposite the entrances 42b. In this case, the inner wall surface 42d of the insertion hole 42a in the lid plate 42 is the inclined surface 42d1 inclined to the external connection terminal 29 with respect to the direction in which the external connection terminal 29 is inserted into the insertion hole 42a. If the contact part 17 is fixed in a state in which it inclines with respect to the principal plane of the ceramic circuit board 14, then the external connection terminal 29 also inclines. When this external connection terminal 29 is inserted into the insertion hole 42a in the lid plate 42, the external connection terminal 29 slides along the inclined surface 42d1 in the insertion hole 42a and is kept perpendicular to the principal plane of the ceramic circuit board 14. The lid plate 42 is fixed in this state. Accordingly, the external connection terminal 29 protruding from the lid plate 42 of the sheath case 40 is fixed to a proper position on a printed-circuit board 50. As a result, assemblability is improved. Furthermore, in this case, a lower end portion and an upper end portion of the external connection terminal 29 are supported by the contact part 17 and the lid plate 42 respectively. That is two say, the external connection terminal 29 is supported at the two points. As a result, the perpendicularity of the external connection terminal 29 relative to the ceramic circuit board 14 is maintained. Accordingly, workability is improved when the printed-circuit board 50 is fixed to the external connection terminal 29.

According to the disclosed technique, an external connection terminal is kept perpendicular and deterioration in assemblability is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
  a substrate including
    an insulating plate, and
    a conductive plate formed on a front surface of the insulating plate;
  a semiconductor chip formed on a front surface of the conductive plate;
  a contact part arranged on the conductive plate with a bonding member therebetween;
  an external connection terminal including a rod-shaped body portion, the body portion having a lower end portion thereof fitted into the contact part; and
  a lid plate having a front surface and a back surface, the back surface facing the substrate, the lid plate having an insertion hole that pierces the lid plate, forming an entrance and an exit respectively on the back and front surfaces of the lid plate, the body portion of the external connection terminal being inserted in the insertion hole, wherein
  the semiconductor device has a first configuration and a second configuration, the first configuration being that the body portion has a guide portion fixed to a portion of a side of the body portion, the portion of the body portion being housed in the insertion hole, the second configuration being that the insertion hole has an inclined inner wall, the guide portion and the inclined inner wall having an inclined surface inclining towards a center of the external connection terminal with respect to a direction from the entrance to the exit, and
  the inclined surface of the inner wall is above, with respect to an up-down direction that is a direction from the front surface to the back surface of the lid plate, the inclined surface of the guide portion of the external connection terminal inserted fully therein.

2. The semiconductor device according to claim 1, wherein:
  a frictional force between the external connection terminal inserted into the insertion hole of the lid plate and the insertion hole is weaker than a fitting force between the external connection terminal and the contact part.

3. The semiconductor device according to claim 1, wherein the guide portion includes a plurality of wedge-shaped portions, each with the inclined surface.

4. The semiconductor device according to claim 1, wherein the guide portion encloses the body portion of the external connection terminal in a top view, is made of a resin having a round or elliptical shape in a side view, and has the inclined surface as a part of an outer surface of the guide portion.

5. The semiconductor device according to claim 1, wherein the guide portion is made of an elastic member having a half-ring shape in a side view, and has the inclined surface as a part of an outer surface of the guide portion.

6. The semiconductor device according to claim 1, wherein:
  the inclined surface of the inner wall is put upon the inclined surface of the guide portion of the external connection terminal.

7. The semiconductor device according to claim 1, wherein:
  the inner wall of the insertion hole has the inclined surface, such that the insertion hole is diameter-reduced from the entrance to the exit in a side view.

8. The semiconductor device according to claim 1, wherein a part of the inclined surface of the inner wall is in contact with a part of the inclined surface of the guide portion of the external connection terminal.

9. The semiconductor device according to claim 8, wherein the part of the inclined surface of the inner wall is in contact with the part of the inclined surface of the guide portion of the external connection terminal inserted fully in the insertion hole.

10. A semiconductor device manufacturing method of manufacturing a semiconductor device, comprising:
  preparing
    a substrate including an insulating plate and a conductive plate formed on a front surface of the insulating plate, an external connection terminal including a rod-shaped
body portion, and
a lid plate having a front surface and a back surface, the
lid plate having an insertion hole piercing there-
through to form an entrance and an exit respectively
on the back and front surfaces of the lid plate;
bonding a semiconductor chip to the conductive plate and
bonding a contact part to the conductive plate with a
bonding member therebetween, over a principal plane
of the substrate;
fitting a lower end portion of the body portion of the
external connection terminal into the contact part; and
fixing the lid plate by opposing the back surface of the lid
plate to the principal plane of the substrate and insert-
ing the body portion of the external connection terminal
into the insertion hole from the entrance to the exit,
wherein
the semiconductor device has a first configuration and a
second configuration, the first configuration being that
the body portion has a guide portion fixed to a portion
of a side of the body portion, the portion of the body
portion being housed in the insertion hole, the second
configuration being that the insertion hole has an
inclined inner wall, the guide portion and the inclined
inner wall having an inclined surface inclining towards
a center of the external connection terminal with
respect to a direction in which the external connection
terminal is inserted into the insertion hole, and
after the step of inserting the body portion of the external
connection terminal into the insertion hole from the
entrance to the exit, the inclined surface of the inner
wall is above, with respect to an up-down direction that
is a direction from the front surface to the back surface
of the lid plate, the inclined surface of the guide portion
of the external connection terminal inserted fully
therein.

11. The semiconductor device manufacturing method according to claim 10, wherein in the fixing of the lid plate, the external connection terminal is guided from the entrance to the exit along the inclined surface, to be thereby inserted into the insertion hole.

12. The semiconductor device manufacturing method according to claim 8, wherein:
in the fixing of the lid plate, the lid plate is fixed by putting the inclined surface of the inner wall upon the inclined surface of the guide portion of the external connection terminal, and pressing the lid plate against the substrate.

13. The semiconductor device manufacturing method according to claim 10, wherein after the step of inserting the body portion of the external connection terminal into the insertion hole from the entrance to the exit, a part of the inclined surface of the inner wall is in contact with a part of the inclined surface of the guide portion of the external connection terminal.

14. The semiconductor device manufacturing method according to claim 13, wherein the part of the inclined surface of the inner wall is in contact with the part of the inclined surface of the guide portion of the external connection terminal inserted fully in the insertion hole.

15. A semiconductor device, comprising:
a substrate including
an insulating plate, and
a conductive plate formed on a front surface of the insulating plate;
a semiconductor chip formed on a front surface of the conductive plate;
a contact part arranged on the conductive plate with a bonding member therebetween;
an external connection terminal including a rod-shaped body portion, the body portion having a lower end portion thereof fitted into the contact part; and
a lid plate having a front surface and a back surface, the back surface facing the substrate, the lid plate having an insertion hole that pierces the lid plate, forming an entrance and an exit respectively on the back and front surfaces of the lid plate, the body portion of the external connection terminal being inserted in the insertion hole, wherein
the semiconductor device has a first configuration and a second configuration, the first configuration being that the body portion has a guide portion fixed to a portion of a side of the body portion, the portion of the body portion being housed in the insertion hole, the second configuration being that the insertion hole has an inclined inner wall, the guide portion and the inclined inner wall having an inclined surface inclining towards a center of the external connection terminal with respect to a direction from the entrance to the exit, and
a part of the inclined surface of the inner wall is in contact with a part of the inclined surface of the guide portion of the external connection terminal inserted fully in the insertion hole.

16. The semiconductor device according to claim 15, wherein the guide portion includes a plurality of wedge-shaped portions, each with the inclined surface.

17. The semiconductor device according to claim 15, wherein:
a frictional force between the external connection terminal inserted into the insertion hole of the lid plate and the insertion hole is weaker than a fitting force between the external connection terminal and the contact part.

18. The semiconductor device according to claim 15, wherein the guide portion encloses the body portion of the external connection terminal in a top view, is made of a resin having a round or elliptical shape in a side view, and has the inclined surface as a part of an outer surface of the guide portion.

19. The semiconductor device according to claim 15, wherein the guide portion is made of an elastic member having a half-ring shape in a side view, and has the inclined surface as a part of an outer surface of the guide portion.

20. The semiconductor device according to claim 15, wherein:
the inner wall of the insertion hole has the inclined surface, such that the insertion hole is diameter-reduced from the entrance to the exit in a side view.

* * * * *